(12) United States Patent
Lin et al.

(10) Patent No.: US 7,218,565 B2
(45) Date of Patent: May 15, 2007

(54) METHOD AND APPARATUS FOR INDEPENDENTLY REFRESHING MEMORY CAPACITORS

(75) Inventors: Yu-Chang Lin, Hsinchu County (TW); Ying-Te Tu, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 494 days.

(21) Appl. No.: 10/707,652

(22) Filed: Dec. 30, 2003

(65) Prior Publication Data
US 2005/0035959 A1 Feb. 17, 2005

(30) Foreign Application Priority Data
Aug. 15, 2003 (TW) .............................. 92122455 A

(51) Int. Cl.
*G11C 7/00* (2006.01)
(52) U.S. Cl. ...................... 365/222; 365/227; 365/149
(58) Field of Classification Search ................ 365/222, 365/227, 149
See application file for complete search history.

(56) References Cited

U.S. PATENT DOCUMENTS

| 4,747,082 | A | * | 5/1988 | Minato et al. ............... 365/222 |
| 5,825,711 | A | * | 10/1998 | Manning ................ 365/230.03 |
| 6,327,209 | B1 | * | 12/2001 | Schaefer ...................... 365/222 |
| 6,434,076 | B1 | * | 8/2002 | Andersen et al. ........... 365/222 |
| 6,504,780 | B2 | * | 1/2003 | Leung ......................... 365/222 |
| 6,646,944 | B2 | * | 11/2003 | Shimano et al. ............. 365/222 |
| 6,741,515 | B2 | * | 5/2004 | Lazar et al. ................. 365/222 |
| 2003/0161208 | A1 | * | 8/2003 | Nakashima et al. ........ 365/222 |
| 2005/0060488 | A1 | * | 3/2005 | Poechmueller .............. 711/106 |

* cited by examiner

*Primary Examiner*—Son Dinh
*Assistant Examiner*—Eric J. Wendler
(74) *Attorney, Agent, or Firm*—Jianq Chyun IP Office

(57) ABSTRACT

A method for refreshing a memory capacitor is provided. First, the refresh controller provides a refresh control signal. The pre-decoded row address counter counts and outputs a regular pre-decoded row address in response to the refresh control signal. The regular pre-decoded row address is inputted to the pre-decoded row address re-driver to obtain a row address. The memory capacitor in response to the row address is refreshed.

9 Claims, 4 Drawing Sheets

METHOD AND APPARATUS FOR INDEPENDENTLY REFRESHING MEMORY CAPACITORS

CROSS REFERENCE TO RELATED APPLICATIONS

This application claims the priority benefit of Taiwan application serial no. 92122455, filed Aug. 15, 2003.

BACKGROUND OF INVENTION

1. Field of the Invention

This invention generally relates to refresh memory capacitor, and more particularly to independently refresh memory capacitors without an address driver and latch.

2. Description of Related Art

Memory devices storing data are indispensable to personal computers and other electronic equipment. Memory devices include two main categories: Read Only Memory (ROM) and Random Access Memory (RAM). RAM is readable and rewritable. Dynamic RAM (DRAM) can represents binary data (0 or 1) by using capacitors storing or not storing charges. A capacitor represents a bit, where a capacitor with charges represents a binary "1"; a capacitor without charges represents a binary "0". A byte usually being used as a unit for digital date storage consists of eight bits. A unit for digital data storage in a memory device is called a memory cell. Memory cells are arranged in arrays. The combination of a specific column and a specific row represent an address for a specific memory cell. Memory cells in the same column or same row are serial-connected by a common conducting line.

The word "Random" in Random Access Memory means that this type of memory cell in DRAM allows to be read from any memory address; "Access" means DRAM is readable and rewritable, which is the major difference from ROM. A memory device consists of a plurality of memory cells. A conventional method for accessing a specific memory cell is the row-column addressing method, which orderly decodes the row address and the column address of the specific memory cell.

Referring to FIG. 1, which is a structural view depicting a 2 KB memory. First, a row address signal 118 is sent. At the same time a row enable signal 115 is sent to activate the row address decoding latch (a row decoder driving signal) in order to enable the 6×64 row decoder 106. The 6×64 row decoder 106 decodes the row address signal to obtain the row address and sends the row address to the memory. Row 27 is exemplary as depicted in FIG. 1. After decoding the row address, a column enable signal is sent to activate the column address decoding latch (a column decoder driving signal) in order to enable the 6×64 column decoder 103. The 6×64 column decoder 103 decodes the column address signal to obtain the column address and sends the column address to the memory. Notice that column 35 is exemplary in FIG. 1. After obtaining the column and column addresses, the memory cell 109 at address 27×35 is found, and is ready to be accessed later.

The Row Address Strobe (RAS) comprises the first step for memory address decoding; whereas the Column Address Strobe (CAS) comprises the second step for memory address decoding and memory accessing. The step of RAS further comprises decoding and latching, which requires an address latch and an address driver. The address latch is a circuit to maintain the present status via triggering clock or recovered control signal before receiving the next clock signal even input changes. Hence, the row address is latched until the column address is acquired.

FIG. 2 is a block diagram of a conventional apparatus for refreshing memory capacitors. Referring to FIG. 2, while refreshing the memory capacitors, refresh controller 204 will output a refresh control signal to trigger the refresh counter 202 outputting a refresh address signal to the address driver 206. Then the address driver 206 outputs an address driving signal to the row address pre-decoder 210. The row address pre-decoder 210 outputs a pre-decoded row address to the pre-decoded row address re-driver 214 for re-driving. Then the re-driven pre-decoded row address is sent to the core device 212 to refresh the memory capacitor. While reading/rewriting the memory cell, the address register 208 provides the address driver 206 with an address signal. Then the reading/rewriting operation can be performed via the row address pre-decoder 210, the pre-decoded row address re-driver 214, and the core device 212.

It is required to use an address driver in the conventional method while refreshing the capacitors or accessing the memory cells. However, the address driver is a power-consuming device, thus it is worth considering to reduce power consumption during standby mode from this point of view.

SUMMARY OF INVENTION

An object of the present invention is to provide a method and apparatus for refreshing memory capacitors without an address driver so as to reduce power consumption during standby mode.

The present invention provides a method for refreshing a memory capacitor. The method comprises: the refresh controller providing a refresh control signal; the pre-decoded row address counter outputting a regular pre-decoded row address according to the refresh control signal; inputting the pre-decoded row address to the pre-decoded row address re-driver to obtain a row address; and refreshing a memory capacitor according to the row address.

The present invention provides an apparatus for refreshing a memory capacitor, comprising: a refresh controller, a pre-decoded row address counter, a pre-decoded row address re-driver, and a core device. Firstly the refresh controller provides a refresh control signal inputting to the pre-decoded row address counter. The input of which is coupled to the refresh controller, and the output terminal comprises a plurality of pre-decoded row address lines. Then, the pre-decoded row address counter counts according to the refresh control signal to obtain a regular pre-decoded row address so as to input to the pre-decoded row address re-driver. The pre-decoded row address re-driver serves to re-drive upon receiving the pre-decoded row address, and outputs the address to the core device that is coupled to the pre-decoded row address re-driver, so as to refresh the memory capacitor.

Compared to the conventional method, the present invention, after the pre-decoded row address counter counts, acquires a pre-decoded row address without any address driver or row address decoder. Hence, when an electronic device is on the standby mode, the power required to refresh the memory capacitors is effectively reduced.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

Most system memory devices configuring personal computers are DRAMs. Although it takes time to refresh the memory cells so that the speed of DRAM is slower than the Static Random Access Memory (SRAM), yet DRAM is much cheaper, and the chip per se occupies smaller room, thus unit chip area is more productive, and smaller than SRAM. Hence, DRAM is well used in systems requiring high memory capacity.

Figure 1:
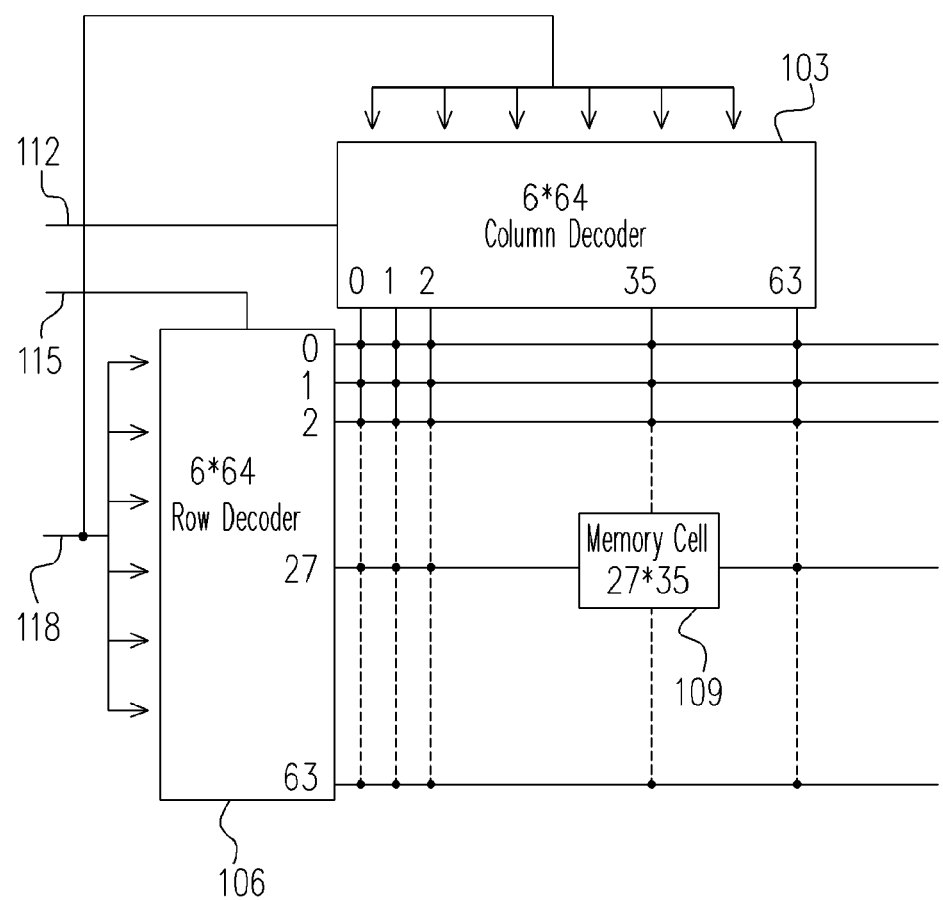
FIG. 1 is a structural view of a 2 KB memory.
Figure 2:
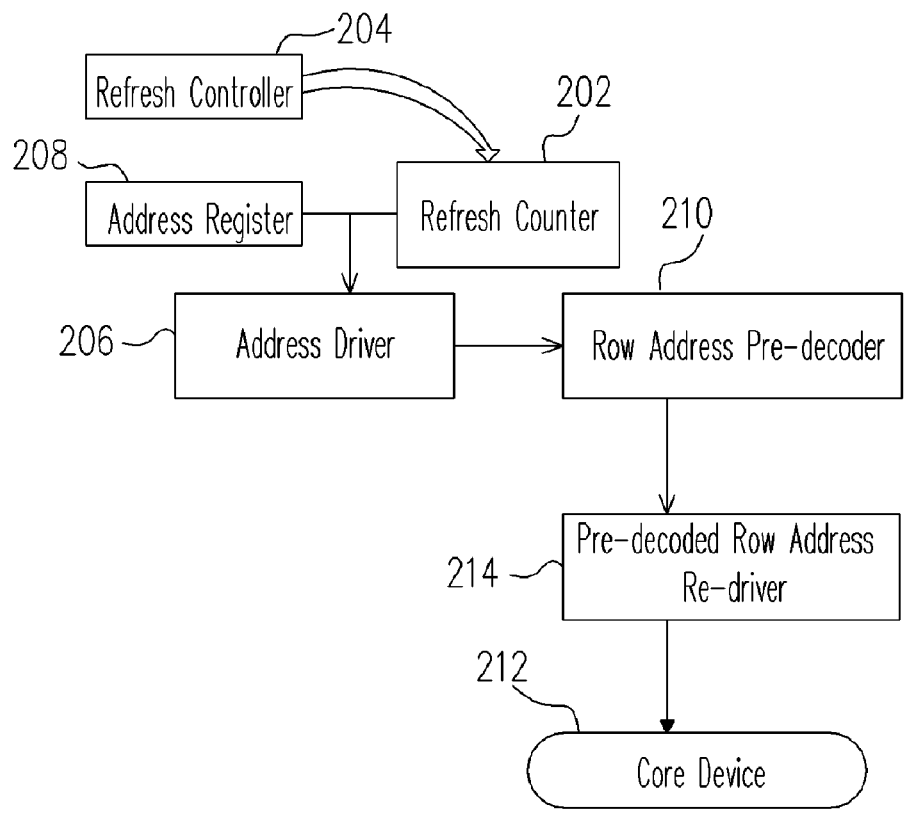
FIG. 2 is a block diagram of a conventional apparatus for refreshing memory capacitors.
Figure 3:
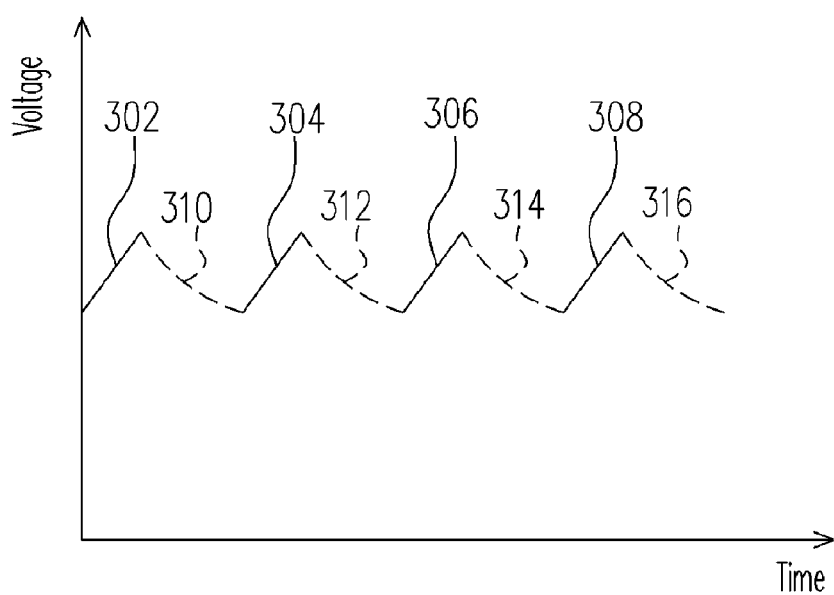
FIG. 3 shows a charge period for a random access memory.

The data in DRAM are retained by continuously charging. To avoid losing the data, the data in the memory cells have to be read and rewritten in a period of time no matter if the memory cell is being accessed. This periodic operation is called a refresh operation. During each refresh operation, the system has to read and rewrite the data in each memory cell to before leakage of charges in the memory capacitors has ruined the data. The refresh operation is repeated hundreds of times per second. FIG. 3 shows a charge period for a random access memory. Curves 302, 304, 306, and 308 show the relationship between voltage and time during charging the memory capacitors. Curves 310, 312, 314, and 316 show the relationship between voltage and time during the leakage of the charges in the memory capacitors.

Figure 4:
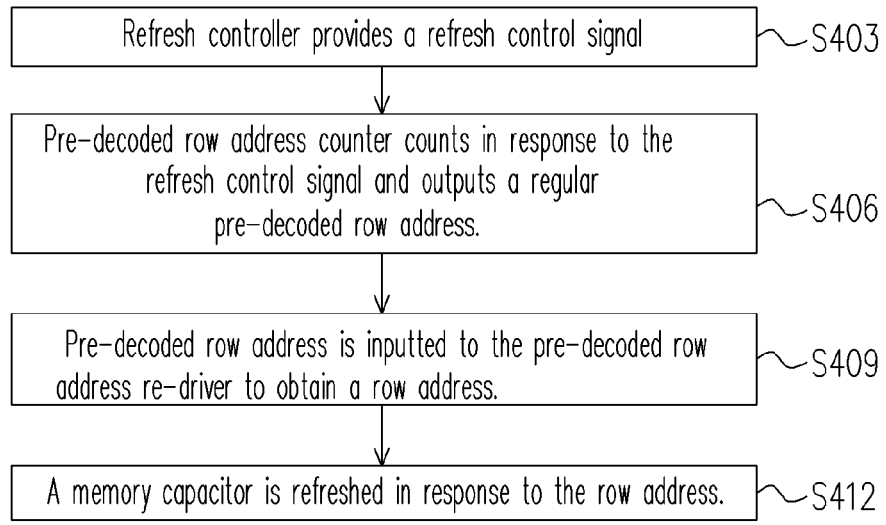
FIG. 4 is a flow chart depicting refreshing memory capacitors in accordance with a preferred embodiment of the present invention.

FIG. 4 is a flow chart illustrating the method for refreshing memory capacitors in accordance with a preferred embodiment of the present invention. Referring to FIG. 4, the refresh controller provides a refresh control signal (S403). The refresh controller is coupled to an input terminal of a pre-decoded row address counter. The refresh control signal is sent to the pre-decoded row address counter. The pre-decoded row address counter counts and outputs a regular pre-decoded row address in response to the refresh control signal (S406). The pre-decoded row address is inputted to the pre-decoded row address re-driver to obtain a row address (S409). Then a memory capacitor is refreshed in response to the row address (S412).

Figure 5:
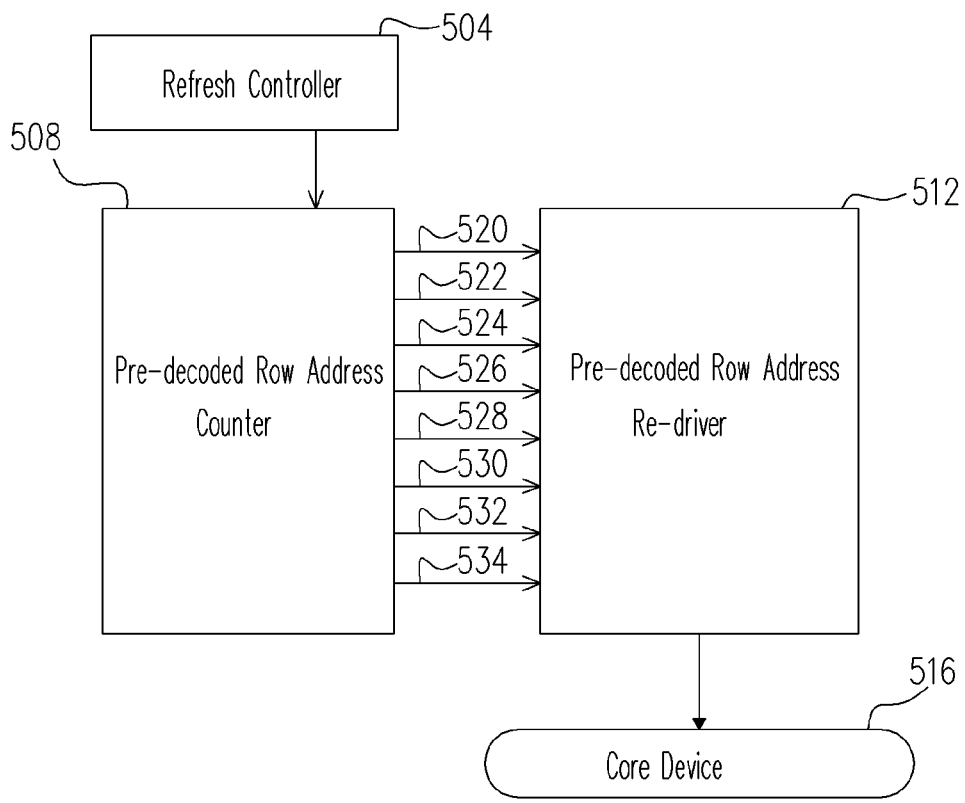
FIG. 5 is a block diagram of an apparatus depicting refreshing memory capacitors in accordance with a preferred embodiment of the present invention.

FIG. 5 is a block diagram illustrating an apparatus for refreshing memory capacitors in accordance with a preferred embodiment of the present invention. Referring to FIG. 5, the apparatus comprises a refresh controller 504, a pre-decoded row address counter 508, a pre-decoded row address re-driver 512, and a core device 516. The output terminal of the refresh controller 504 is coupled to the pre-decoded row address counter 508. The pre-decoded row address counter 508 comprises a plurality of pre-decoded row address lines coupled to the pre-decoded row address re-driver 512. The output terminal of the pre-decoded row address re-driver 512 is coupled to the core device 516. The refresh controller 504 outputs a refresh control signal to the pre-decoded row address counter 508. In one embodiment of the present invention, the refresh control signal can be a signal having one or more bits such as ($A_0$, $A_1$, and $A_2$) to represent the address at which a particular portion of the memory cells is going to be refreshed. The pre-decoded row address counter 508 receives the refresh control signal and counts. Then the pre-decoded row address counter 508 outputs a regular pre-decoded row address. The pre-decoded row address counter 508 will output the corresponding multi-bit pre-decoded row address to the pre-decoded row address re-driver 512. It should be noted that in this embodiment the refresh control signal is a 3-bit signal, yet the control signal having different bits is also within the scope of the present invention.

The pre-decoded row address re-driver 512 receives the corresponding pre-decoded row address and re-drives to output a pre-decoded row address to the core device 516. The core device 516 in response to the pre-decoded row address refreshes a memory capacitor.

In another embodiment of the present invention, the refresh controller 504 outputs a control signal in every period such as a pulse signal. The pre-decoded row address counter 508 counts in response to the control signal. The pre-decoded row address counter 508 receives and switches the output of the plurality of pre-decoded row address lines coupled to the pre-decoded row address re-driver 512. The output of the plurality of pre-decoded row address lines can be one or more bits. For example, when the refresh controller 504 outputs the control signal for the first time, the pre-decoded row address counter 508 enable the pre-decoded row address line 520 and disable the pre-decoded row address lines 522–534. Hence, the pre-decoded row address counter 508 does not require a decoder therein, which can reduce the power consumption for refreshing operation.

Figure 6:
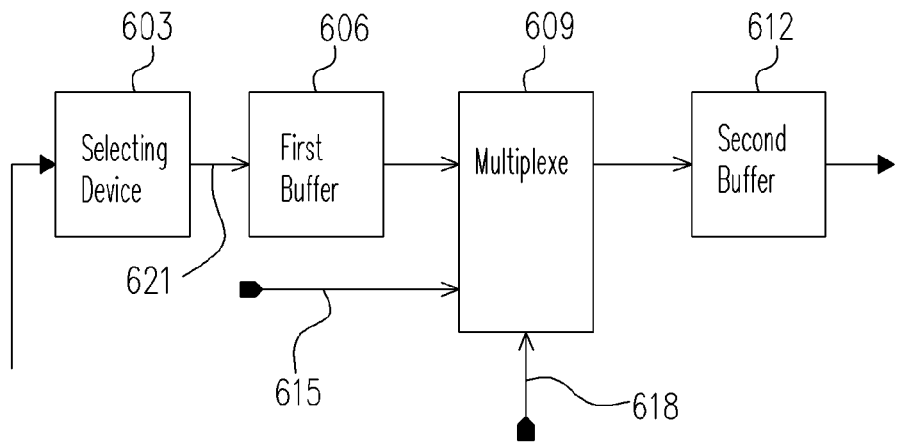
FIG. 6 is a block diagram of a pre-decoded row address re-driver for obtaining a pre-decoded row address in accordance with a preferred embodiment of the present invention.

FIG. 6 is a block diagram illustrating a pre-decoded row address re-driver for obtaining a pre-decoded row address in accordance with a preferred embodiment of the present invention. Referring to FIG. 6, this circuit is to determine which one of the address signal 621 and the address counting data 615 is the pre-decoded row address. It is determined by a control signal 618. In an embodiment of the present invention, this circuit comprises a selecting device 603 processing a plurality of signals from the address driver and outputting an address signal 621, and a multiplexer 609 coupled to the selecting device 603. The multiplexer 609 receives the address signal 621 from the selecting device 603, and the address counting data 615 from the pre-decoded row address counter. The multiplexer 609 in response to a control signal 618 outputs one of the address signal 621 and the address counting data 615 as the pre-decoded row address. In another embodiment of the present invention, a first buffer 606 and a second buffer 612 can be respectively inserted between the selecting device 603 and the multiplexer 609, and between the multiplexer 609 and the core device. Thus the output of the selecting device 603 and the multiplexer 609 is stabilized, and the output transmitting rate of the multiplexer 609 is adjusted.

Figure 7:
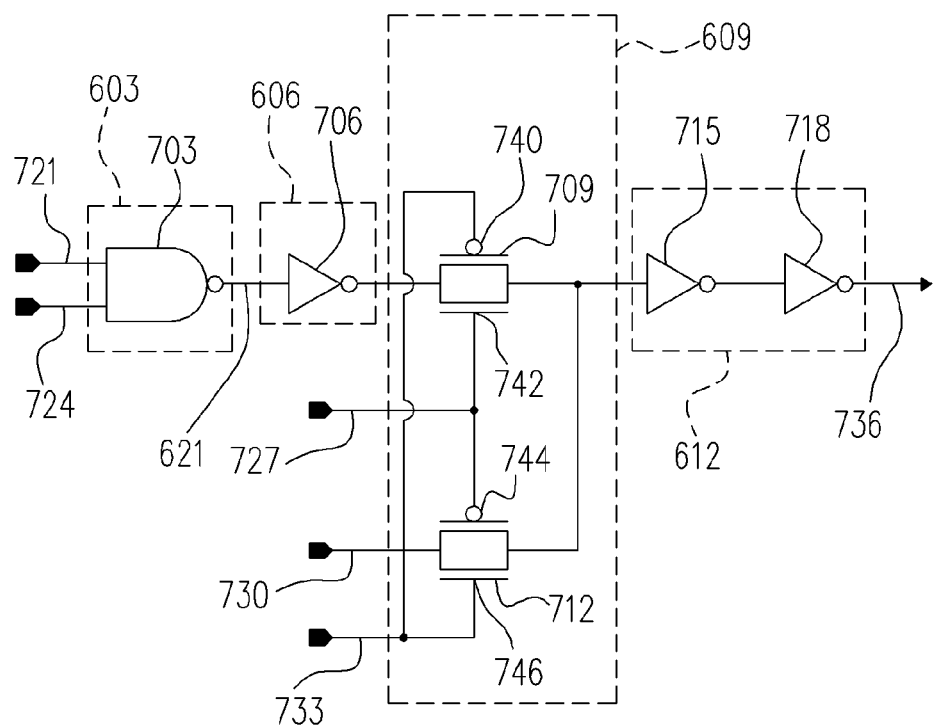
FIG. 7 is a logic diagram illustrating a pre-decoded row address re-driver for obtaining a pre-decoded row address in accordance with a preferred embodiment of the present invention.

FIG. 7 is a logic diagram illustrating a pre-decoded row address re-driver for obtaining a pre-decoded row address in accordance with a preferred embodiment of the present invention. Referring to FIGS. 6 and 7, the selecting device 603 is implemented by an NAND gate 703. The first and second buffers 606 and 612 are implemented by a NOT gate 706, and two NOT gates 715 and 718, respectively. The multiplexer 609 are implemented by two transmission gates 709 and 712 on the other hand. The NAND gate 703 performs the NAND operation on the address signals 721 and 724 and outputs an address signal 621. It should be noted that the input terminals of the NAND gate 703 are two, but the present invention is not limited by the embodiment. Then the address signal 621 is sent to the NOT gate 706 to adjust the transmission rate of the address signal 621 and to stabilize the address signal 621. Then the NOT gate 706 sends the address signal 621 to the input terminal of the first transmission gate 709.

The two transmission gates 709 and 712 are described herein. The first and second transmission gates 709 and 712 respectively comprises four terminals, including input and output terminals, first terminals 740 and 744, and second terminals 742 and 746 respectively. The output terminals of the first and second transmission gates 709 and 712 are electrically connected. The input terminal of the first transmission gate 709 is connected to the NOT gate 706 to receive the address signal 621; the first terminal 740 receives the second control signal 733; and the second terminal 742 is connected to the first terminal 744 of the second transmission gate 712 to receive the first control signal 727. The input terminal of the second transmission gate 712 receives the address counting data 730; the first terminal 744 receives the first control signal; the second terminal 746 received the second control signal 733. If the first transmission gate 709 is on, the address signal 621 is the pre-decoded row address 736. If the second transmission gate 712 is on, the address counting data 730 is the pre-decoded row address 736.

In this embodiment of the present invention, the first and second transmission gates 709 and 712 can use but not limited to N-type or P-type material to implement. A first control signal 727 having a high voltage level and a second control signal 733 having a low voltage level can be used to turn on the first transmission gate 709. A first control signal 727 having a low voltage level and a second control signal 733 having a high voltage level can be used to turn on the second transmission gate 712. A switch can also be used to output one of the address signal 621 and the address counting data 730.

The input terminal of the second NOT gate 715 is connected to the output terminals of the first and second transmission gates 709 and 712 to output one of the address signal 621 and the address counting data 730 as the pre-decoded row address 736. The combination of the second NOT gate 715 and the third NOT gate 718 are deemed to the second buffer 612 in FIG. 6 to stabilize and adjust the transmission rate of the output of the first and second transmission gates 709 and 712. The output of the second buffer is the output of the pre-decoded row address re-driver 512.

Further, the pre-decoded row address counter 508 that is mentioned in the foregoing preferred embodiment is one of the characters in the present invention. To avoid using the latch and the address driver, the pre-decoded row address counter 508 has N input terminals and has $2^N$ pre-decoded row address lines. The pre-decoded row address re-driver 512 has $2^N$ input terminals connected to $2^N$ output terminals of the pre-decoded row address counter 508. Then the output terminal of the pre-decoded row address re-driver 512 is electrically connected to the core device 516. The core device 516 refreshes the memory capacitor based on the pre-decoded row address. Because the output terminal of the pre-decoded row address counter 508 can be directly connected to the pre-decoded row address re-driver 512, the decoding result can be obtained quickly. Further, no address latch or address driver is used. Hence, the power consumption is effectively reduced.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

The invention claimed is:

1. A method for independently refreshing a memory capacitor, for a system at least comprising a refresh controller coupled to an input terminal of a pre-decoded row address counter, an output terminal of said pre-decoded row address counter being coupled to an input terminal of a pre-decoded row address re-driver, said method comprising:
    said refresh controller providing a refresh control signal;
    said pre-decoded row address counter counting a regular pre-decoded row address in response to said refresh control signal;
    inputting said regular pre-decoded row address to said pre-decoded row address re-driver to obtain a row address; and
    refreshing a memory capacitor according to said row address.

2. The method of claim 1, further comprising
    determining one of an address counting data and an address signal according to a control signal; and
    inputting said determined one of said address counting data and said address signal to said pre-decoded row address re-driver.

3. An apparatus for refreshing a memory capacitor, comprising:
    a refresh controller providing a refresh control signal;
    a pre-decoded row address counter, said pre-decoded row address counter comprising a plurality of pre-decoded row address lines, said pre-decoded row address counter being couple to said refresh controller and receiving said refresh control signal to count, said pre-decoded row address counter outputting a regular pre-decoded row address in response to said refresh control signal via said pre-decoded row address lines;
    a pre-decoded row address re-driver, coupled to said plurality of pre-decoded row address lines, for receiving and re-driving said corresponding pre-decoded row address and outputting a pre-decoded row address; and
    a core device coupled to said pre-decoded row address re-driver, wherein said core device refreshes a memory capacitor according to said pre-decoded row address.

4. The apparatus of claim 3, wherein said pre-decoded row address counter has N input terminals and has 2N pre-decoded row address lines.

5. The apparatus of claim 3, wherein said pre-decoded row address re-driver further comprises:
    a selecting device, for selecting a signal from an input terminal of said selecting device and outputting an address signal; and
    a multiplexer, coupled to said selecting device, for outputting one of said address signal and said regular pre-decoded row address according to a control signal.

6. The apparatus of claim 5, wherein said selecting device is a NAND gate.

7. The apparatus of claim 5, wherein said multiplexer comprises two transmission gates.

8. The apparatus of claim 5, wherein said pre-decoded row address re-driver comprises:
- a first buffer, coupled to said multiplexer and said selecting device, for receiving and stabilizing said address signal, and adjusting a transmitting rate of said address signal; and
- a second buffer, coupled to said selecting device, for receiving and stabilizing said one of said address signal and said regular we-decoded row address, and for adjusting a transmitting rate of said one of said address signal and said regular pro-decoded row address.

9. The apparatus of claim 8, wherein said first buffer and said second buffer are inverters.

* * * * *